(12) United States Patent
Inoue et al.

(10) Patent No.: US 11,018,085 B2
(45) Date of Patent: May 25, 2021

(54) SEMICONDUCTOR DEVICE

(71) Applicant: SAMSUNG ELECTRONICS CO., LTD., Suwon-si (KR)

(72) Inventors: Naoya Inoue, Ansan-si (KR); Dong Won Kim, Hwaseong-si (KR); Young Woo Cho, Yongin-si (KR); Ji Won Kang, Seoul (KR); Song Yi Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 15/464,773

(22) Filed: Mar. 21, 2017

(65) Prior Publication Data

US 2017/0278786 A1  Sep. 28, 2017

(30) Foreign Application Priority Data

Mar. 22, 2016  (KR) .......................... 10-2016-0034031

(51) Int. Cl.
*H01L 29/51* (2006.01)
*H01L 23/522* (2006.01)
*H01L 21/768* (2006.01)
*H01L 23/532* (2006.01)

(52) U.S. Cl.
CPC ...... *H01L 23/5222* (2013.01); *H01L 21/7682* (2013.01); *H01L 23/5226* (2013.01); *H01L 23/53295* (2013.01); *H01L 21/76834* (2013.01); *H01L 23/53223* (2013.01); *H01L 23/53238* (2013.01); *H01L 23/53266* (2013.01)

(58) Field of Classification Search
CPC ............. H01L 21/7682; H01L 23/5226; H01L 29/0649; H01L 29/515; H01L 2221/1042; H01L 23/53295
See application file for complete search history.

(56) References Cited

U.S. PATENT DOCUMENTS 7,449,407 B2  11/2008  Lur et al.
7,473,632 B2   1/2009  Ueda
7,666,753 B2   2/2010  Bonilla et al.
(Continued)

FOREIGN PATENT DOCUMENTS

JP   2007-188919 A   7/2007

OTHER PUBLICATIONS

Fischer, et al. Low-k Interconnect Stack with Multi-Layer Air Gap and Tri-Metal-Insulator-Metal Capacitors for 14nm High Volume Manufacturing, IEEE 2015.

*Primary Examiner* — Kenneth Parker
*Assistant Examiner* — John Lin
(74) *Attorney, Agent, or Firm* — Lee IP Law, P.C.

(57) ABSTRACT

A semiconductor device includes a first lower line and a second lower line on a substrate, the first and second lower lines extending in a first direction, being adjacent to each other, and being spaced apart along a second direction, orthogonal the first direction, an airgap between the first and second lower lines and spaced therefrom along the second direction, a first insulating spacer on a side wall of the first lower line facing the second lower line, wherein a distance from the first airgap to the first lower line along the second direction is equal to or greater than an overlay specification of a design rule of the semiconductor device, and a second insulating spacer between the airgap and the second lower line.

8 Claims, 13 Drawing Sheets

(56) References Cited

U.S. PATENT DOCUMENTS

| | | | |
|---|---|---|---|
| 7,790,601 B1 | 9/2010 | Choi et al. | |
| 7,830,014 B2 | 11/2010 | Ueda | |
| 8,034,693 B2 | 10/2011 | Shibata et al. | |
| 8,247,902 B2 | 8/2012 | Noguchi et al. | |
| 8,420,528 B2 | 4/2013 | Noguchi | |
| 8,872,304 B2 | 10/2014 | Oshida | |
| 9,105,693 B2 | 8/2015 | Edelstein et al. | |
| 9,123,727 B2 | 9/2015 | Fischer | |
| 9,514,981 B1 * | 12/2016 | Badami | H01L 21/76831 |
| 2009/0302473 A1 | 12/2009 | Shibata et al. | |
| 2011/0140275 A1 * | 6/2011 | Noguchi et al. | H01L 21/7682 257/751 |
| 2013/0207269 A1 * | 8/2013 | Oshida | H01L 23/5222 257/762 |
| 2014/0183735 A1 * | 7/2014 | Zhang | H01L 23/5384 257/741 |
| 2015/0037980 A1 * | 2/2015 | Rha | H01L 21/306 438/700 |
| 2015/0333009 A1 * | 11/2015 | Lin | H01L 23/53223 257/751 |
| 2016/0126130 A1 * | 5/2016 | Takahashi | H01L 21/7682 257/774 |

\* cited by examiner

SEMICONDUCTOR DEVICE

CROSS-REFERENCE TO RELATED APPLICATION

Korean Patent Application No. 10-2016-0034031, filed on Mar. 22, 2016, in the Korean Intellectual Property Office, and entitled: "Semiconductor Device," is incorporated by reference herein in its entirety.

BACKGROUND

1. Field

The present disclosure relates to a semiconductor device and a method of manufacturing the same, and more specifically, to a semiconductor device including airgaps formed between lines for a method of manufacturing the same.

2. Description of the Related Art

In the back end of line (BEOL) process of semiconductor devices, it is one of important issues to pattern a plurality of lines with no interference between the lines. As recent semiconductor devices scale down rapidly, spacing between lines becomes narrower. Accordingly, there has been proposed an approach for reducing capacitance between lines by forming airgaps between the lines.

SUMMARY

One or more embodiments may provide a semiconductor device that includes a first lower line and a second lower line on a substrate a first lower line and a second lower line on a substrate, the first and second lower lines extending in a first direction, being adjacent to each other, and being spaced apart along a second direction, orthogonal to the first direction, an airgap between the first and second lower lines and spaced therefrom along the second direction, a first insulating spacer on a side wall of the first lower line facing the second lower line, wherein a distance from the first airgap to the first lower line along the second direction is equal to or greater than an overlay specification of a design rule of the semiconductor device, and a second insulating spacer between the airgap and the second lower line.

One or more embodiments may provide a semiconductor device that includes a first interlayer insulation film on a substrate, a first lower line and a second lower line in the first interlayer insulation film, the first and second lower lines extending in a first direction, being adjacent to each other, and being spaced apart along a second direction, orthogonal to the first direction, a first airgap and a second airgap between the first lower layer and the second lower line, wherein the first airgap is spaced apart from the first lower line by a first distance along the second direction and the second airgap is spaced apart from the second lower line by a second distance along the second direction.

One or more embodiments may provide a semiconductor device that includes a first lower line and a second lower line formed on a substrate and adjacent to each other, a spacer that covers opposed side walls of the first lower line and the second lower line, a first trench defined by the spacer, an interlayer insulation film covering the first and second lower lines, and a bottom surface and side walls of the first trench to partially fill the first trench, a first airgap defined by the first trench and the interlayer insulation film pattern, and a via at least partially overlapping the first lower line and penetrating the interlayer insulation film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
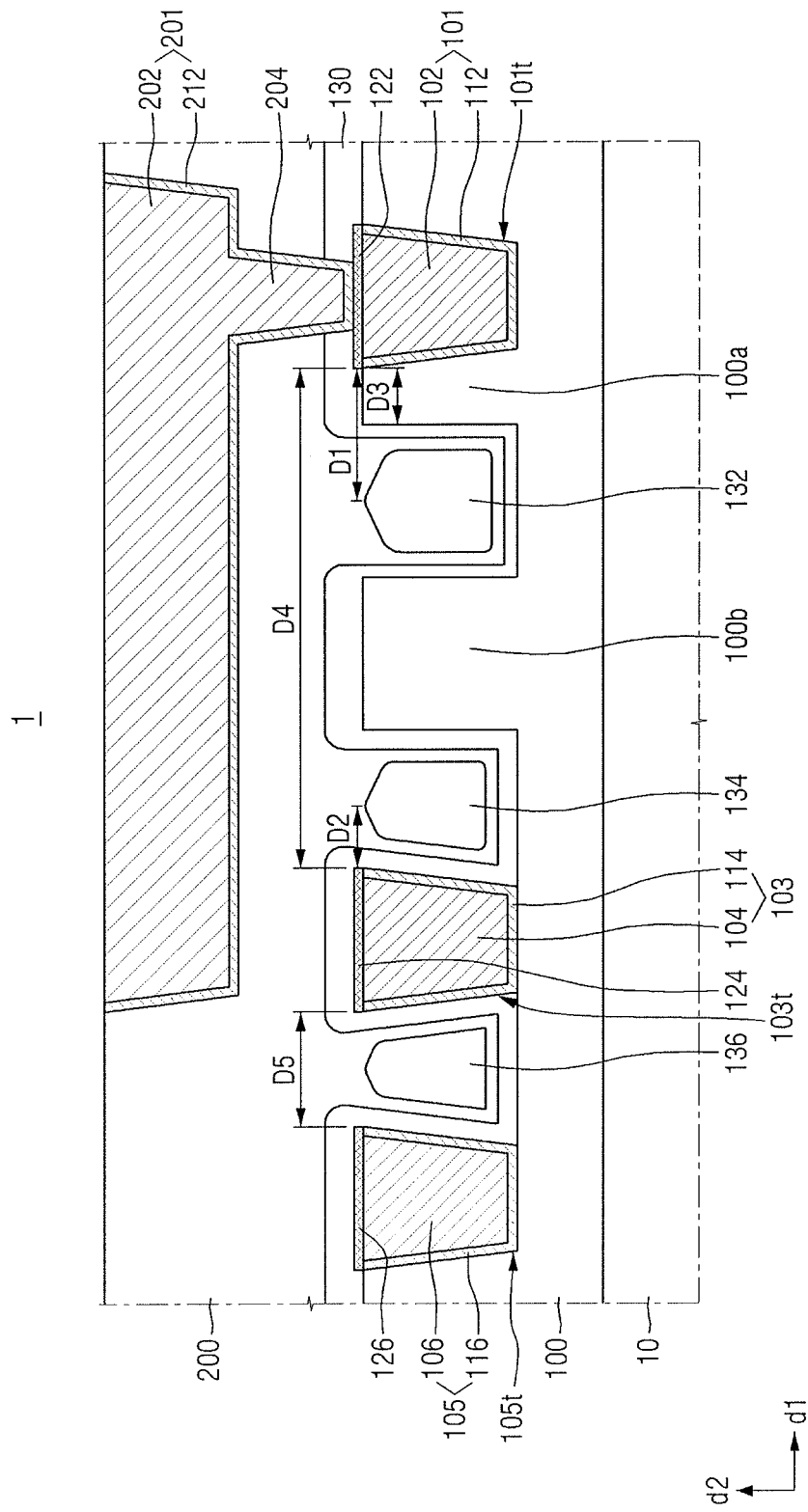
FIG. 1 illustrates a cross-sectional view of a semiconductor device according to an exemplary embodiment of the present disclosure.
Figure 2:
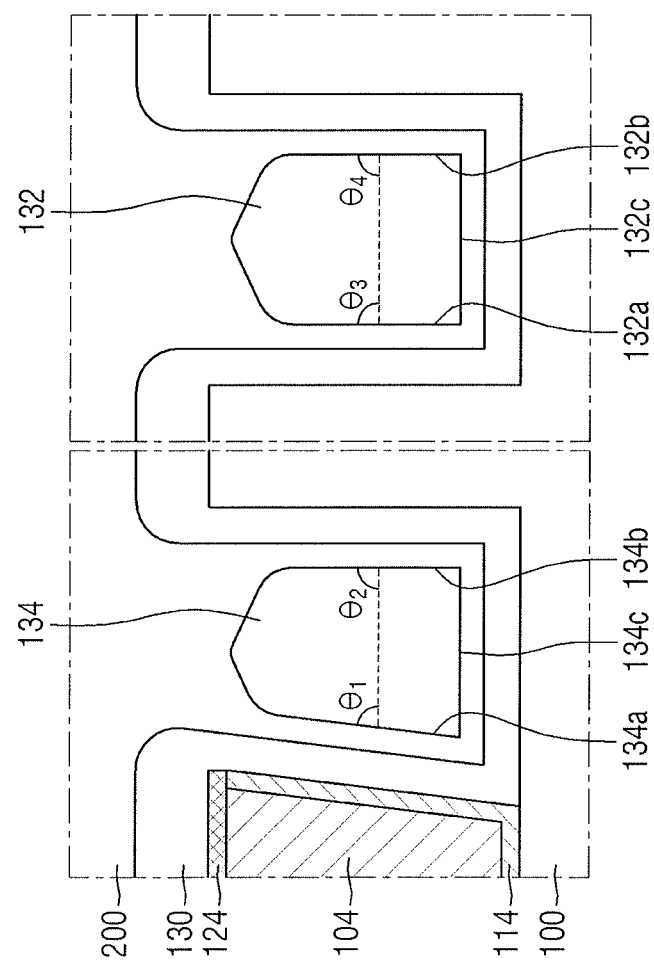
FIG. 2 illustrates an enlarged view of a portion of the semiconductor device shown in FIG. 1.

FIG. 1 is a cross-sectional view of a semiconductor device according to an exemplary embodiment of the present disclosure. FIG. 2 is an enlarged view of a portion of the semiconductor device shown in FIG. 1.

Referring to FIG. 1, a semiconductor device 1 according to an exemplary embodiment of the present disclosure includes a substrate 10, a first interlayer insulation film 100 formed on the substrate 10, first to third lower lines 101, 103 and 105 formed in the first interlayer insulation film 100, first to third airgaps 132, 134 and 136, a second interlayer insulation film 200 formed on the first interlayer insulation film 100, a via 204, and an upper line 201, all stacked in a first direction d1.

The substrate 10 may be, for example, a bulk silicon substrate or a SOI (silicon-on-insulator) substrate. Alternatively, the substrate 100 may be a silicon substrate or may be a substrate made of other materials, e.g., silicon germanium (SiGe), indium antimonide (InSb), lead-telluride (PbTe) compound, indium arsenide (InAs), indium phosphide (InP), gallium arsenide (GaAs), and gallium antimonide (GaSb). Alternatively, the substrate 10 may be formed by growing an epitaxial layer on a base substrate. In the following description, the substrate 10 is a silicon substrate.

The first interlayer insulation film 100 may be formed on the substrate 10. The first interlayer insulation film 100 may include, for example, at least one of a low-k dielectric material, an oxide film, a nitride film and an oxynitride film. The low-k dielectric material may include, but is not limited to, flowable oxide (FOX), tonen silazene (TOSZ), undoped silica glass (USG), borosilica glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof.

Although not shown in FIG. 1, a semiconductor element, e.g., a transistor or a memory element included in the semiconductor device 1 according to the exemplary embodiment of the present disclosure may be disposed between the substrate 10 and the interlayer insulation film 100.

Figure 5:
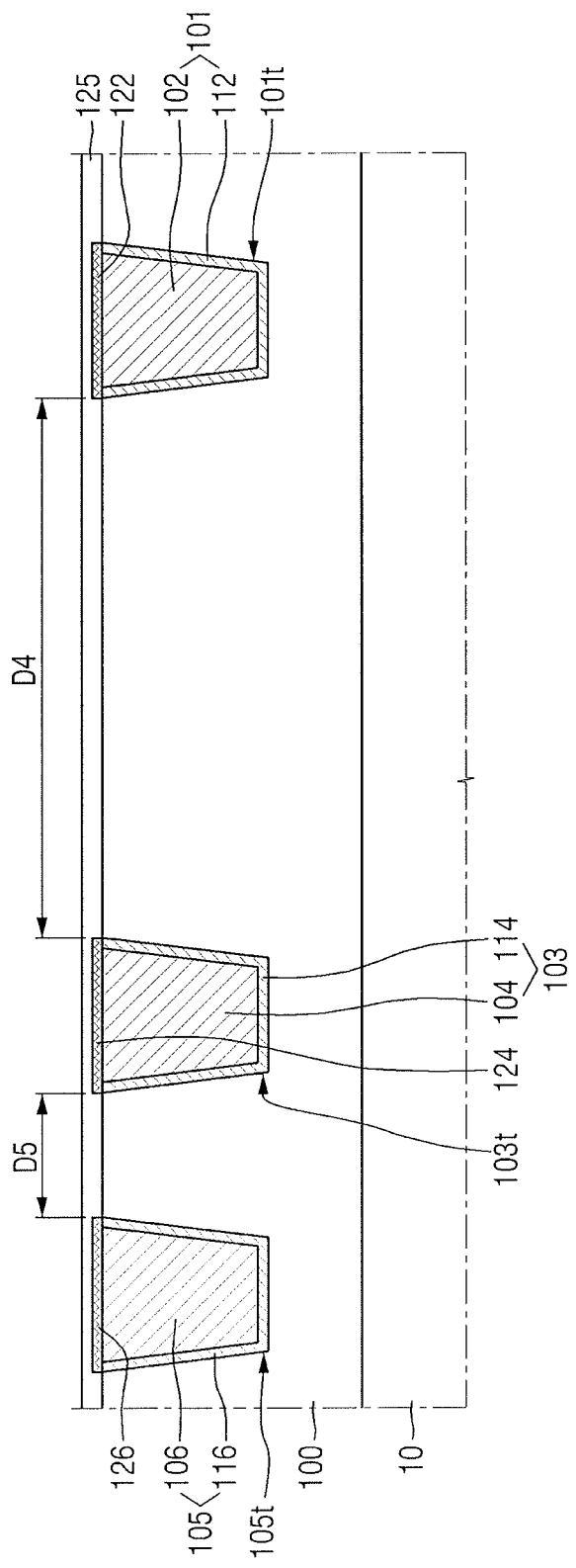
FIGS. 5 to 8 illustrate cross-sectional views of stages a method for manufacturing a semiconductor device according to an exemplary embodiment of the present disclosure.

The first to third lower lines 101, 103, and 105 may be formed in the interlayer insulation film 100, e.g., in respective trenches 101t, 103t, and 105t (see FIG. 5).

The first lower line 101 may include a first metal 102 and a first barrier metal 112 surrounding side walls and a bottom surface of the first metal 102. The first barrier metal 112 may be formed such that it conforms to the side walls and the bottom surface of the trench 101t. The trench 101t may be fully filled with the first metal 102.

The first metal 102 may be formed on the first barrier metal 112 formed along the inner walls of the first lower line 101. The first metal 102 may include, but is not limited to, at least one of conductive materials e.g., copper (Cu), aluminum (Al), cobalt (Co), titanium (Ti), titanium nitride (TiN), tantalum (Ta) and tantalum nitride (TaN). In the semiconductor device according to this exemplary embodiment, the first metal 102 includes copper (Cu).

The first barrier metal 112 may be formed such that it conforms to the inner walls of the first lower line 101. The first barrier metal 112 may prevent the conductive material contained in the first metal 102 from diffusing into the first interlayer insulation film 100 during the process of forming the first metal 102, e.g., using a single damascene process or a dual damascene process.

The first barrier metal 112 may include, for example, at least one of titanium, titanium nitride, tantalum and tantalum nitride. The first barrier metal 112 may be made up of a single layer or two or more layers of such materials.

The second lower line 103 may include a second metal 104 and a second barrier metal 114 surrounding side walls and a bottom surface of the second metal 104. The second barrier metal 114 may be formed such that it conforms to the side walls and the bottom surface of the corresponding trench 103t. The corresponding trench 103t may be fully filled with the second metal 104. The space defined by the side walls of the second barrier metal 114 may be filled with the second metal 104.

The second metal 104 and the second barrier metal 114 may include, but is not limited to, the same materials as the first metal 102 and the first barrier metal 112, respectively.

The third lower line 105 may include a third metal 106 and a third barrier metal 116 surrounding side walls and a bottom surface of the third metal 106. The third barrier metal 116 may be formed such that it conforms to the side walls and the bottom surface of the corresponding trench 105t. The corresponding trench 105t may be fully filled with the third metal 106. The space defined by the side walls of the third barrier metal 116 may be filled with the third metal 106.

The third metal 106 and the third barrier metal 116 may include, but are not limited to, the same materials as the first metal 102 and the first barrier metal 112, respectively.

The first to third lower lines 101, 103, and 105 may have a tapered shape that becomes narrower toward their bottoms, i.e., closer to the substrate 10.

First to third capping films 122, 124, and 126 may be formed such that they cover the first to third lower lines 101, 103, and 105, respectively.

The first capping film 122 may prevent the first lower line 101 from being damaged during the process of forming the first to third airgaps 132, 134, and 136. Likewise, the second capping film 124 and the third capping film 126 may prevent the second and third lower lines 103 and 105 from being damaged during the process of forming the first to third airgaps 132, 134, and 136. The first to third capping films 122, 124, and 126 may include, but are not limited to, cobalt silicide (CoSi). More specifically, the first to third capping films 122, 124, and 126 may include, e.g., metal silicide, metal nitride, metal oxide, metal silicate and metal oxynitride, which are combined with cobalt (Co), tungsten (W), titanium (Ti), tantalum (Ta), aluminum (Al) and alloys thereof.

The first to third capping films 122, 124 and 126 may be deposited on the first to third lower lines 101, 103 and 105 by chemical vapor deposition (CVD) or electroless deposition (ELD). In some embodiments, the first to third capping films 122, 124, and 126 may be omitted as necessary.

The distance D4 along a second direction d2 from the first lower line 101 to the second lower line 103, i.e., a distance between facing edges of the first and second lower lines 101 and 103, may differ from the distance D5 along the second direction d2 from the second lower line 103 to the third lower line 105, i.e., a distance between facing edges of the second and third lower lines 103 and 105. More specifically, the distance D4 from the first lower line 101 to the second lower line 103 may be larger than the distance D5 from the second lower line 103 to the third lower line 105.

The first lower line 101 may be adjacent to the second lower line 103. In other words, no other lower line may be interposed between the first lower line 101 and the second lower line 103. Likewise, the second lower line 103 may be adjacent to the third lower line 105, i.e., no other lower line may be interposed therebetween.

The second lower line 103 and the third lower line 105 may be spaced apart from each other by a general spacing according to the design rule of the semiconductor device 1 of the exemplary embodiment of the present disclosure. That is, the distance D5 may be a general spacing between lines according to the design rule of the semiconductor device 1 according to the exemplary embodiment of the present disclosure.

On the other hand, the first lower line 101 and the second lower line 103 may be spaced apart from each other according to a wide spacing scheme in the semiconductor device 1 of the exemplary embodiment of the present disclosure. That is, the distance D4 may be referred to as wide spacing compared to the general spacing according to the design rule of the semiconductor device 1 according to the exemplary embodiment of the present disclosure.

A liner film 130 may be formed to cover the first interlayer insulation film 100 and the first to third lower lines 101, 103, and 105. The liner film 130 may be formed along the outer walls of the first interlayer insulation film 100 and the first to third lower lines 101, 103 and 105 to conform them.

The liner film 130 may include, for example, at least one of silicon nitride (SiN), silicon carbide (SiC), silicon carbon nitride (SiCN) and a combination thereof.

The first to third airgaps 132, 134, and 136 may be formed in the first interlayer insulation film 100, e.g., below an upper surface of the insulation film 100, i.e., the insulation layer 100 extends in the first direction d1 from the substrate 10 further than an upper portion of the first to third airgaps 132, 134, and 136. Specifically, the first airgap 132 and the second airgap 134 may be formed between the first lower line 101 and the second lower line 103, and the third airgap 136 may be formed between the second lower line 103 and the third lower line 105.

The first airgap 132 may store air therein. The first airgap 132 is a gap defined by nearby insulation films and has a dielectric constant lower than that of silicon oxide or the like. Accordingly, the parasitic capacitance between the lower lines can be reduced. By, reducing the parasitic capacitance between the lower lines, the performance and operation reliability of the semiconductor device 1 can be improved while the power consumption can be reduced.

As shown in FIG. 1, the first to third airgaps 132, 134, and 136 may be completely surrounded by the first interlayer insulation film 100 and the second interlayer insulation film 200 formed on the liner film 130. Alternatively, some of the first to third airgaps 132, 134, and 136 may be surrounded by the liner film 130.

The shape and the location with respect to the lower line of the first airgap 132 adjacent to the first lower line 101 may differ from those of the second airgap 134 adjacent to the second lower line 103. The first airgap 132 and the second airgap 134 will be described in more detail with reference to FIGS. 1 and 2.

The first airgap 132 may be spaced apart from the first lower line 101 by a first distance D1, e.g., measured from an edge of the first lower line 101 facing the first air gap 132 to a topmost point on an upper surface of the first air gap 132 along the second direction d2. Specifically, the top of the first airgap 132 may be spaced apart from the first lower line 101, e.g., at a widest point thereof, here an upper surface thereof, by the first distance D1 along the second direction d2, while being below the upper surface of the first lower line 101 along the first direction d1.

The second airgap 134 may be spaced apart from the second lower line 103 by a second distance D2, e.g., measured from an edge of the second lower line 103 facing the second air gap 134 to a topmost point on an upper surface of the second air gap 134 along the second direction d2. Specifically, the top of the second airgap 134 may be spaced apart from the second lower line 103 e.g., at a widest point thereof, here an upper surface thereof, by the second distance D2 along the second direction d2, while being below the upper surface of the second lower 103 line along the first direction d1.

The first distance D1 may differ from the second distance D2. In other words, the spacing between the first airgap 132 and the first lower line 101 may be different from the spacing between the second airgap 134 and the second lower line 103.

A first interlayer insulation film 100*a* may be interposed between the first airgap 132 and the first lower line 101. The first interlayer insulation film 100*a* is a type of spacer and may have a width equal to a third distance D3. The third distance D3 may be equal to or larger than the overlay specification in the design rule of the semiconductor device 1 according to the exemplary embodiment of the present disclosure.

For the first airgap 132 adjacent to the first lower line 101 connected to the via 204 and the upper line 201, a conductive metal filling the via 204 may flow to the first airgap 132 due to the misalignment possibly occurring during the process of forming the via 204, such that a short-circuit may be created. To prevent this, the spacer 100*a* having the width equal to the third distance D3 is interposed between the first lower line 101 and the first airgap 132, such that the first airgap 132 can be normally formed even if misalignment occurs during formation of the via.

The angle θ3 made by one side wall 132*a* and the bottom surface 132*c* of the first airgap 132 may be substantially equal to the angle θ4 made by the other side wall 132*b* and the bottom surface 132*c* of the first airgap 132. As used herein, the expression "substantially equal" refers to quantities, values, or dimensions that are within manufacturing variance or tolerance ranges of being perfectly equal.

This will be described in more detail below with respect to a method of manufacturing a semiconductor device 1 according to an exemplary embodiment of the present disclosure. The side walls 132*a* and 132*b* of the first airgap 132 may be defined by performing lithography with a hard mask film pattern, e.g., the side walls 132*a* and 132*b* may be parallel to each other.

On the other hand, a first angle θ1 made by one side wall 134*a* and the bottom surface 134*c* of the second airgap 134 may differ from the second angle θ2 made by the other side wall 134*b* and the bottom surface 134*c* of the second airgap 134, e.g., the side walls 134*a* and 134*b* may not be parallel. Specifically, the side wall 134*a* may tilt towards the side wall 134*b* such that the second angle θ2 may be larger than the first angle θ1.

This is because the side wall 134*a* of the second airgap 134 is self-aligned by the side wall of the second lower line 103 rather than being defined by lithography with a hard mask film pattern. Since the side wall of the second lower line 103 has a tapered shape that becomes narrower toward the bottom, the side wall 134*a* of the second airgap 134 may make an acute angle with the bottom surface 134*c*.

The heights of the first to third airgaps 132, 134, and 136 may not be higher than top surfaces of the first to third light lines 101, 103, and 105, respectively. That is, since top surfaces of the trenches 162, 164, and 166 (see FIG. 7) to be described below with respect to manufacturing processes of the semiconductor device 1 according to an exemplary embodiment of the present disclosure are at the same level with the top surfaces of the first to third lower lines 101, 103, and 105, heights of the first to third airgaps 132, 134 and 136 formed by closing the trenches 162, 164, and 166 (see FIG. 7) is not higher than the top surfaces of the first to third lower lines 101, 103, and 105.

This can achieve the following effect. The first lower line 101 and the second lower line 103 adjacent to each other are formed with wide spacing that is larger than a general spacing between lines according to the design rule of the semiconductor device 1. If the space between the first lower line 101 and the second lower line 103 is entirely formed as an airgap, the height of the airgap may become higher than the top surfaces of the lower lines, such that it may reach the bottom surface of the upper line 201. When this happens, the metal 202 filling the upper line 201 may flow into the airgap formed between the first lower line 101 and the second lower line 103 such that the airgap may fail to be normally formed. As a result, a short-circuit may be created between the upper and lower lines.

In contrast, in the semiconductor device 1 according to the exemplary embodiment of the present disclosure, the first airgap 132 adjacent to the first lower line 101 and the second airgap 134 adjacent to the second lower line 103 may be formed therebetween. Accordingly, the height of the first and second airgaps 132 and 134 may not be higher than the top surfaces of the lower lines 101 and 103. Thus, the metal 202 filling the upper line 201 is less likely to flow into the first and second airgaps 132 and 134. As a result, reliability of the semiconductor device 1 can be improved.

The second interlayer insulation film 200 may be formed to cover the first interlayer insulation film 100, the first to third lower lines 101, 103, and 105, and the liner film 130.

The second interlayer insulation film 200 may include, but is not limited to, the same material as the first interlayer insulation film 100. The first to third airgaps 132, 134 and 136 may be defined by the bottom surface of the second interlayer insulation film 200. In addition, as described above, the first to third airgaps 132, 134 and 136 may be formed due to poor step coverage of the second interlayer insulation film 200.

The upper line 201 may be formed in the second interlayer insulation film 200. The upper line 201 may overlap the first lower line 101 at least partially. The upper line 201 may include a barrier metal 212 that is formed such that it conforms to the inner walls of the upper line 201, and a metal 202 that fills the space defined by the barrier metal 212.

The metal 202 may include, but is not limited to, at least one of conductive materials such as copper (Cu), aluminum (Al), cobalt (Co), titanium (Ti), titanium nitride (TiN), tantalum (Ta), and tantalum nitride (TaN).

The barrier metal 212 may include, e.g., at least one of titanium, titanium nitride, tantalum, and tantalum nitride. The barrier metal 212 may be made up of a single layer or two or more layers of such materials.

The upper line 201 may be connected to the first lower line 101 through the via 204. The via 204 may penetrate the second interlayer insulation film 200. That is, a via hole is formed by penetrating the second interlayer insulation film 200 and then the via hole is filled with a conductive material to thereby form the via 204. The via 204 may include at least one of conductive materials such as copper (Cu), aluminum (Al), cobalt (Co), titanium (Ti), titanium nitride (TiN), tantalum (Ta), and tantalum nitride (TaN).

The barrier metal 212 may also be disposed at the boundary between the via 204 and the second interlayer insulation film 200. That is, the barrier metal 212 may be conformally formed along the inner walls of the via 204. Accordingly, the barrier metal 212 can prevent the conductive material filling the upper line 201 and the via 204 from diffusing into the second interlayer insulation film 200.

Figure 3:
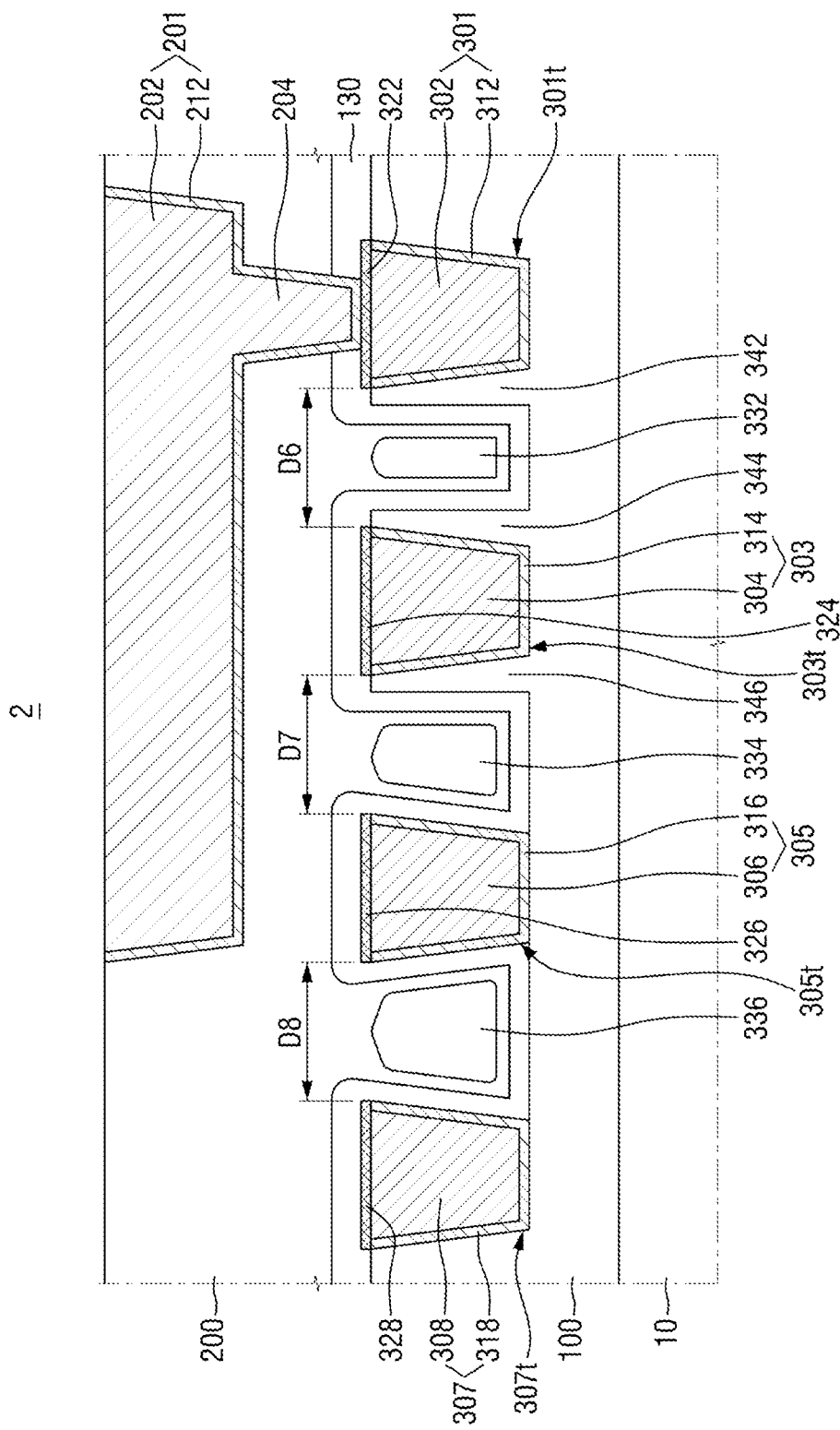
FIG. 3 illustrates a cross-sectional view of a semiconductor device according to another exemplary embodiment of the present disclosure.
Figure 4:
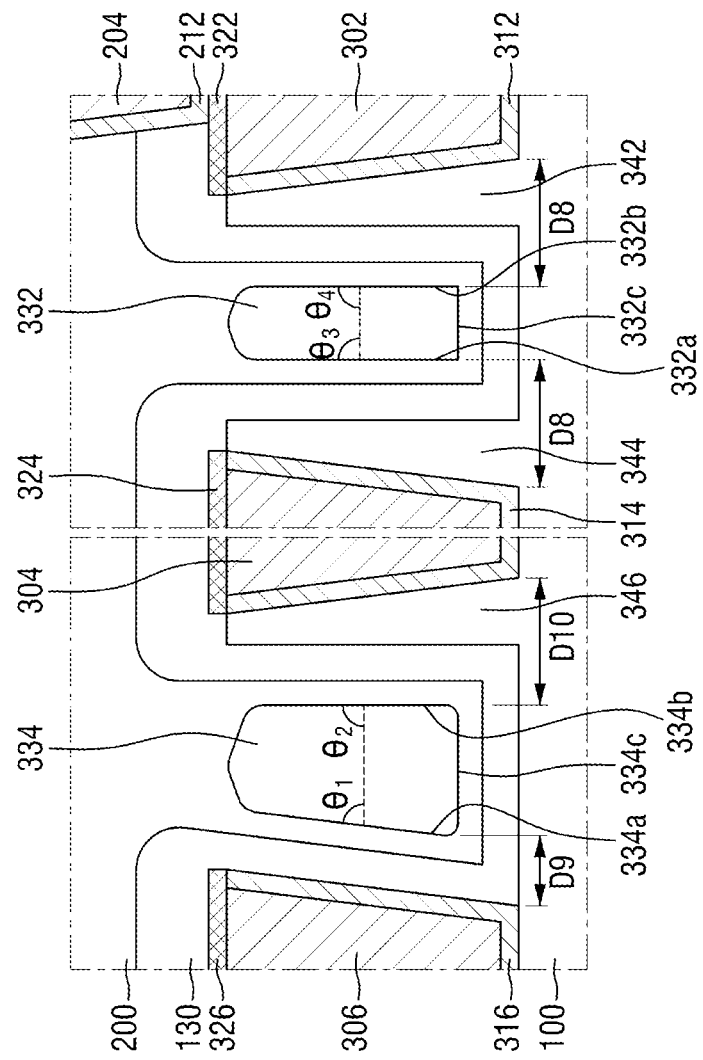
FIG. 4 illustrates an enlarged view of a portion of the semiconductor device shown in FIG. 2.

FIG. 3 is a cross-sectional view of a semiconductor device according to another exemplary embodiment of the present disclosure. FIG. 4 is an enlarged view of a portion of the semiconductor device shown in FIG. 3.

Referring to FIGS. 3 and 4, a semiconductor device 2 according to this exemplary embodiment of the present disclosure may include first to fourth lower electrodes 301, 303, 305 and 307, first to third airgaps 332, 334, and 336, first and second interlayer insulation films 100 and 200, spacers 342, 344, and 346, a liner film 130, an upper line 201, and a via 204. In the following descriptions, descriptions will be made focusing on differences from the above exemplary embodiments, and the redundant description will be omitted.

The semiconductor device 2 includes the first lower electrode 301 connected to the upper electrode 201 and the second to the fourth lower electrode 303, 305 and 307 adjacent to one another. The first airgap 332 may be formed between the first lower electrode 301 and the second lower electrode 303.

A distance D6 along the second direction d2 between the first lower line 301 connected to the upper line 201 through the via 204 and the second lower electrode 303 may correspond to minimum spacing in the design rule of the semiconductor device according to the exemplary embodiment of the present disclosure.

The spacers 342 and 344 may be formed such that they cover the side wall of the first lower electrode 301 and the side wall of the second lower electrode 303 facing each other. In addition, the spacer 346 may be formed to cover the side wall of the second lower electrode 303 facing the third lower electrode 305. That is, the spacers 344 and 346 may be formed on the side walls of the second lower electrode 303, respectively. The spacers 342, 344, and 346 may be formed by patterning the first interlayer insulation film 100. The spacers 342, 344, and 346 may be formed in such a manner that a photoresist pattern is formed such that it covers the first lower electrode 301 and the second lower electrode 303 and then the hard mask film is shrink patterned using the photoresist pattern as an etch mask, as will be described below.

The angle θ3 made by one side wall 332a and the bottom surface 332c of the first airgap 332 may be substantially equal to the angle θ4 made by the other side wall 332b and the bottom surface 132c of the first airgap 332, e.g., the side walls 332 and 332b may be parallel. On the other hand, the angle θ1 made by one side wall 334a and the bottom surface 334c of the second airgap 334 may be different from the angle θ2 made by the other side wall 334b and the bottom surface 334c of the second airgap 332. In particular, the side wall 334a may lean towards the side wall 334b such that the angle θ1 made by the side wall 334a and the bottom surface 334c of the second airgap 334 may be smaller than the second angle θ2 made by the other side wall 334b and the bottom surface 334c of the second airgap 334.

A distance D9 from the side wall 334a of the second airgap 334 to the third lower electrode 305 may be smaller than a distance D10 from the side wall 334b of the second airgap 334 to the second lower electrode 303. This is because of the spacer 346 formed on the side wall of the second lower electrode 303, as described above.

The first airgap 332 may be spaced apart from the first lower electrode 301 and the second lower electrode 303 by a distance D8 by the spacers 342 and 344, respectively.

A distance D8 by which the first airgap 332 is spaced apart from the first and second lower electrodes 303 may be equal to or larger than overlay specification in the design rule of the semiconductor device according to the exemplary embodiment of the present disclosure.

In the semiconductor device 2 according to this exemplary embodiment of the present disclosure, the first airgap 332 is spaced apart from the lower lines 301 and 303 by the spacers 342 and 344 interposed between the first airgap 332 and the lower lines 301 and 303, respectively, it is possible to suppress the first airgap 332 from being connected to the via 204 by the misalignment during the forming of the via 204. As a result, the reliability of the semiconductor device 2 can be improved.

FIGS. 5 to 8 are cross-sectional views of stages in a method of manufacturing a semiconductor device according to an exemplary embodiment of the present disclosure.

Figure 6:
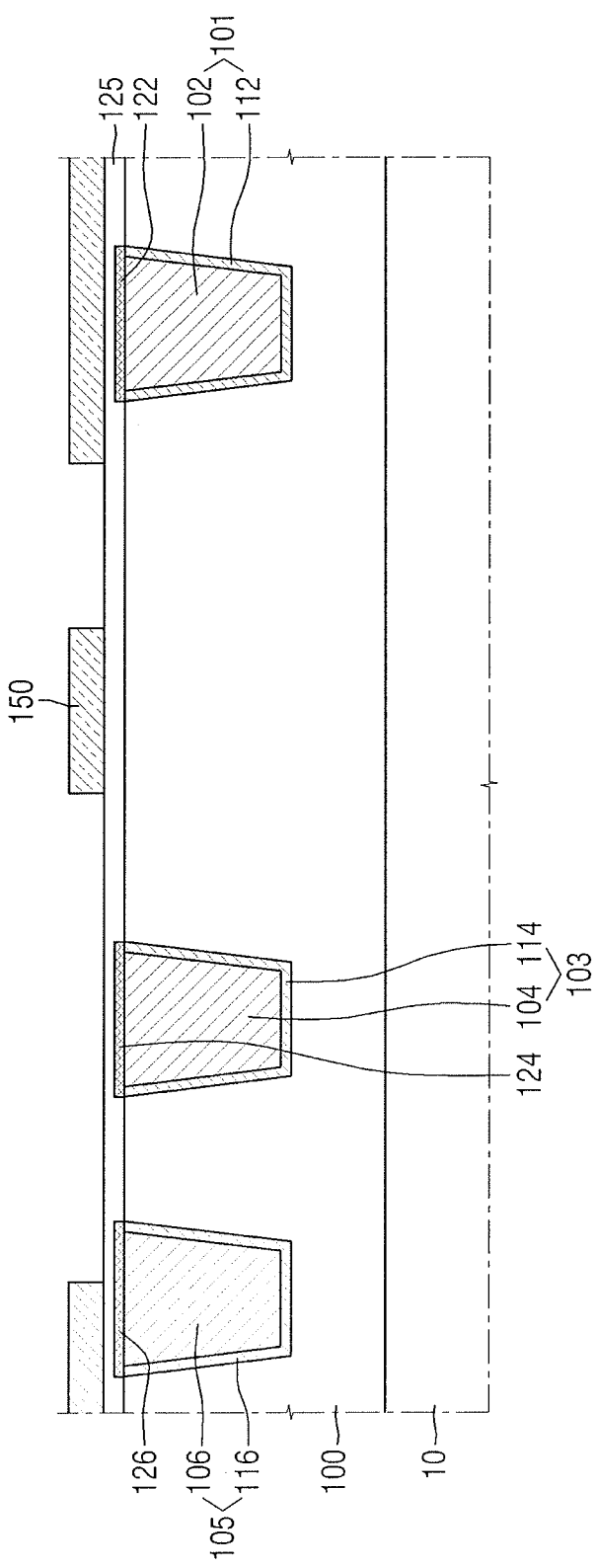

Referring to FIGS. 5 and 6, the first interlayer insulation film 100 is formed on the substrate 10, then respective trenches 101t, 103t, and 105t are formed therein, and first to third lower lines 101, 103, and 105 are formed in the corresponding trenches 101t, 103t, and 105t, respectively. The first lower line 101 is spaced apart from the second lower line 103 by the distance D4, and the second lower line 103 is spaced apart from the third lower line 105 by the distance D5. In some exemplary embodiments of the present disclosure, the distance D4 may be larger than the distance D5.

Forming the first to third lower lines 101, 103 and 105 in the first interlayer insulation film 100 may include forming trenches 101t, 103t, and 105t in the first interlayer insulation film 100 with the first distance D4 and the second distance D5 therebetween, forming barrier metals 112, 114 and 116 in the respective trenches conformally, and filling the trenches with the metals 102, 104 and 106, respectively.

Filling the first to third lower lines 101, 103, and 105 may be performed using a damascene process with the metals 102, 104, and 106 containing a conductive material such as copper (Cu). Subsequently, first to third capping films 122, 124, and 126 may be formed to cover first to third lower lines 101, 103, and 105, respectively.

A first hard mask film 125 may be formed over the first insulation layer 100, the first to third lower lines 101, 103 and 105, and the first to third capping films 122, 124 and 126. A second hard mask pattern 150 may be formed on the first hard mask film. The second hard mask pattern 150 may cover a part of the first interlayer insulation film 100 between the first lower line 101 and the second lower line 103. The second hard mask 150 may completely cover the first lower line 101 and may extend beyond the first lower line 101 along the second direction d2 on both sides thereof. The second hard mask 150 may also partially overlap and extend beyond one side of the third lower line 105 along the second direction d2. The second hard mask pattern 150 may be used for selectively etching the first hard mask film 125 and the first interlayer insulation layer 100.

The first hard mask film 126 may include, but is not limited to, silicon nitride or silicon carbon nitride. The first hard mask film 125 may include an inorganic material containing at least two of silicon (Si), carbon (C), nitrogen (N), oxygen (O), and hydrogen (H).

The second hard mask pattern 150 may include a material having a high etch selectivity with respect to the first hard mask film 125. Specifically, the second hard mask pattern film 150 may include, but is not limited to, titanium nitride or silicon oxide. The second hard mask pattern 150 may have a double-layer structure of a material having a high etch selectivity with respect to the first hard mask film 125 and metal oxide or metal nitride.

Figure 7:
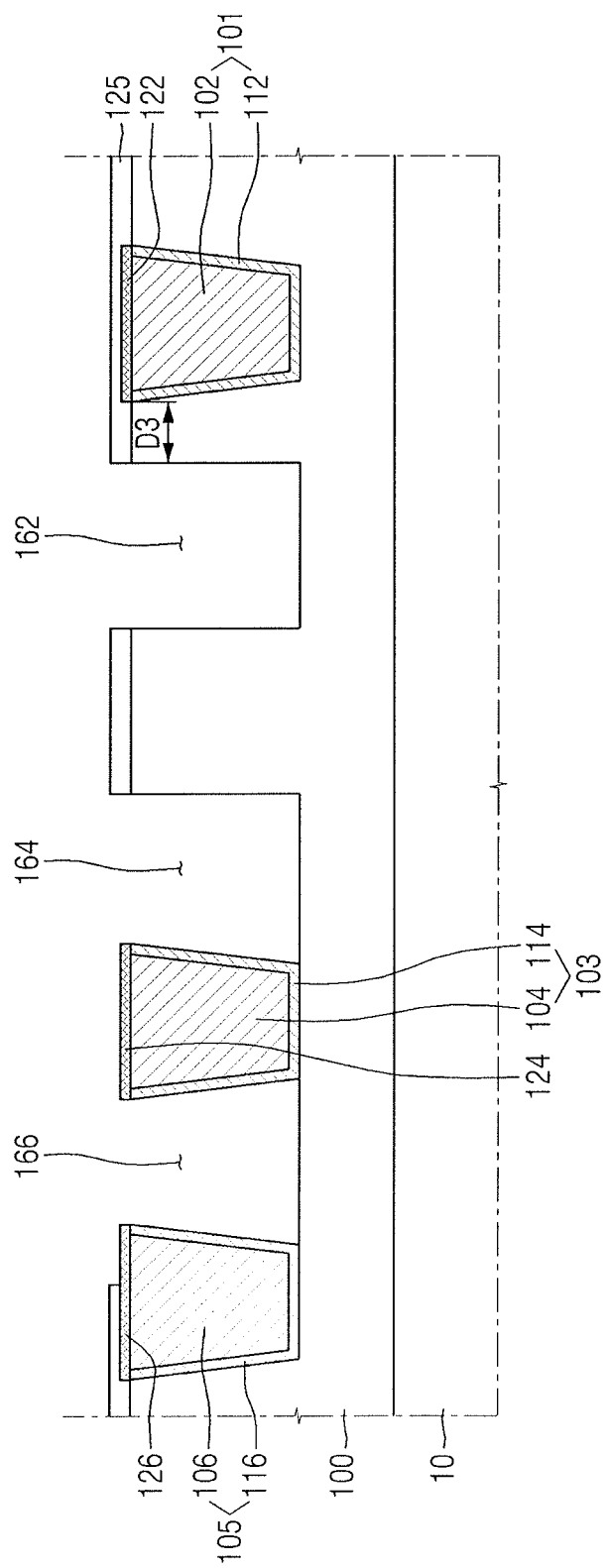

Referring to FIG. 7, the first interlayer insulation film 100 is etched by using the second hard mask pattern 150 as an etch mask. By etching the first interlayer insulation film 100, trenches 162, 164 and 166 may be formed. A portion of the first hard mask film 125 exposed via the second hard mask pattern 150 may also be removed along with the first interlayer insulation film 100.

As shown in FIG. 7, two side walls of a trench 162 are defined by lithography, one side wall of a trench 164 is defined by the second lower line 103 and the other side wall of the trench 164 is defined by lithography, and two side walls of a trench 166 are defined by the second lower line 103 and the third lower line 105, respectively. Accordingly, the fourth to sixth trenches have different shapes. The distance D3 by which the trench 162 is spaced apart from the first lower line 101 may be equal to or larger than the overlay specification. By forming the trenches 162, 164 and 166, the first interlayer insulation layer 100 is partially exposed.

Figure 8:
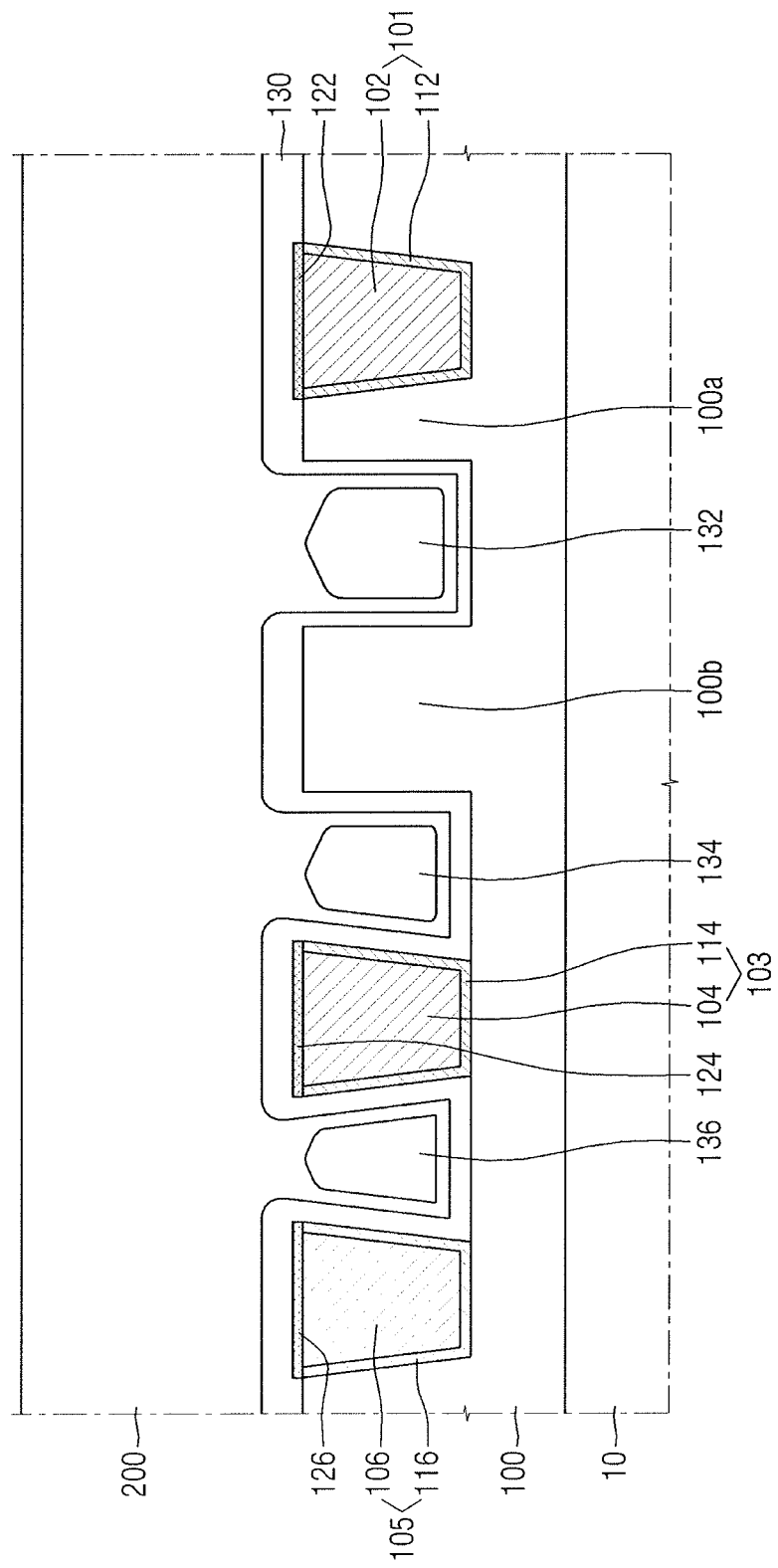

Referring to FIG. 8, the liner film 130 may be formed along the inner walls of the trenches 162, 164, and 166, and the first interlayer insulation film 100 and the top surfaces of the first to third lower lines 101, 103 and 105. The liner film 130 may include the same material as the first hard mask film 125. The liner film 130 may conform to the inner walls of the trenches 162, 164, and 166, but not fill them.

Subsequently, the second interlayer insulation film 200 may be formed on the liner film 130 and the trenches 162, 164, and 166. Although the second interlayer insulation film 200 closes the top surfaces of the trenches 162, 164 and 166, the second interlayer insulation film 200 is deposited with poor step coverage, and thus the trenches 162, 164, and 166 are not completely filled with the second interlayer insulation film 200. Accordingly, the first to third airgaps 132, 134, and 136 may be defined by the liner film 130 and the bottom surface of the second interlayer insulation film 200.

The first interlayer insulation film 100 may be partially formed on side walls and the bottom surfaces of the first to the third airgaps 132, 134, and 136, in addition to the top surfaces depending on the deposition conditions of the first interlayer insulation film 100.

The first airgap 132 is adjacent to the first lower line 101, but is spaced apart from it by the first interlayer insulation film 100a or the spacer interposed between the first airgap 132 and the first lower line 101. Accordingly, the distance between the first airgap 132 and the first lower line 101 may be larger than the distance between the second airgap 134 and the second lower line 103.

Referring back to FIG. 1, a via hole that penetrates the second interlayer insulation film 200 is formed, such that a via 204 and an upper line 201 are formed. The upper line 201 may be connected to the first lower line 101 through the via 204.

FIGS. 9 to 13 are cross-sectional views of stages in a method of manufacturing a semiconductor device according to another exemplary embodiment of the present disclosure. In the following descriptions, descriptions will be made focusing on differences from the above exemplary embodiments, and the redundant description will be omitted.

Figure 9:
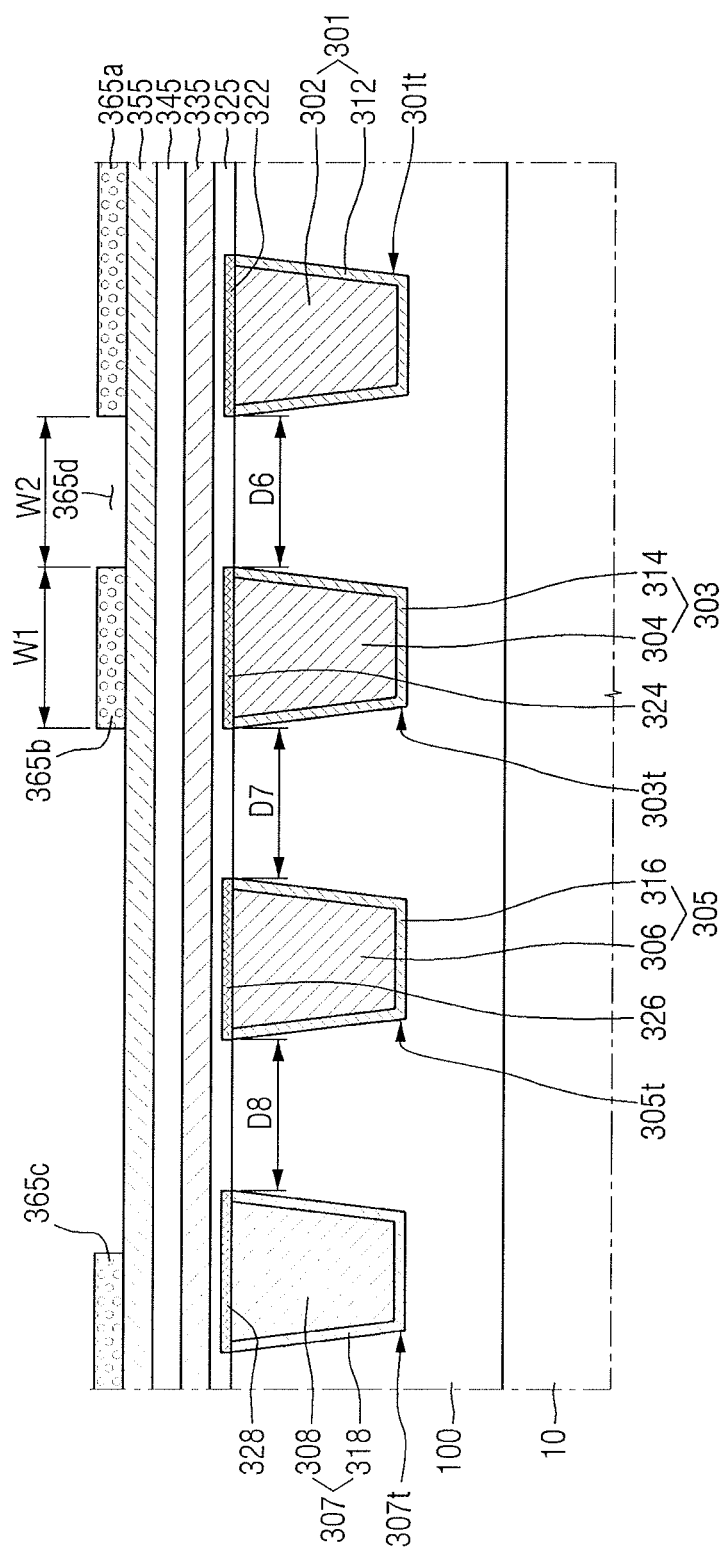
FIGS. 9 to 13 illustrate cross-sectional views of stages in a method of manufacturing a semiconductor device according to another exemplary embodiment of the present disclosure.

Referring to FIG. 9, the first interlayer insulation film 100 is formed on the substrate 10, then trenches 301t, 303t, 305t, and 307t are formed therein, and first to fourth lower lines 301, 303, 305, and 307 are formed in the trenches 301t, 303t, 305t, and 307t, respectively, a first hard mask film 325, a second hard mask film 335, an organic film 345 and a third hard mask film 355 are stacked in this order, in the first direction d1, and then photoresist patterns 365a to 365c may be formed on the third hard mask film 355.

Unlike the method according to the above exemplary embodiment, according to this exemplary embodiment, the distances D6, D7, and D8 between the adjacent lower lines among the first to fourth lower lines 301, 303, 305, and 307 may all be equal.

The organic film 345 may include a spin-on hardmask (SOH), for example. The organic film 345 may be used for transferring a patterned third hard mask film 355 etched using a photoresist as an etch mask to a lower hard mask film layer. The third hard mask film 355 may include, but is not limited to, silicon oxynitride or silicon nitride.

The ends of each of the photoresist patterns 365a and 365b may be in line with the ends of the lower line 301 and the second lower line 303 along the first direction d1, respectively. In particular, the width W1 of the photoresist pattern 365a may be equal to the width of the second lower line 303. An opening 365d having a width W2 equal to the distance D6 between the first lower line 301 and the second lower electrode 303 may be formed by the photoresist patterns 365 and 365a. The distance D1 may correspond to the minimum spacing in the design rule of the semiconductor device according to the exemplary embodiment of the present disclosure. The photoresist pattern 365c may partially cover the fourth lower line 307t and may extend beyond one side thereof along the second direction d2.

Figure 10:
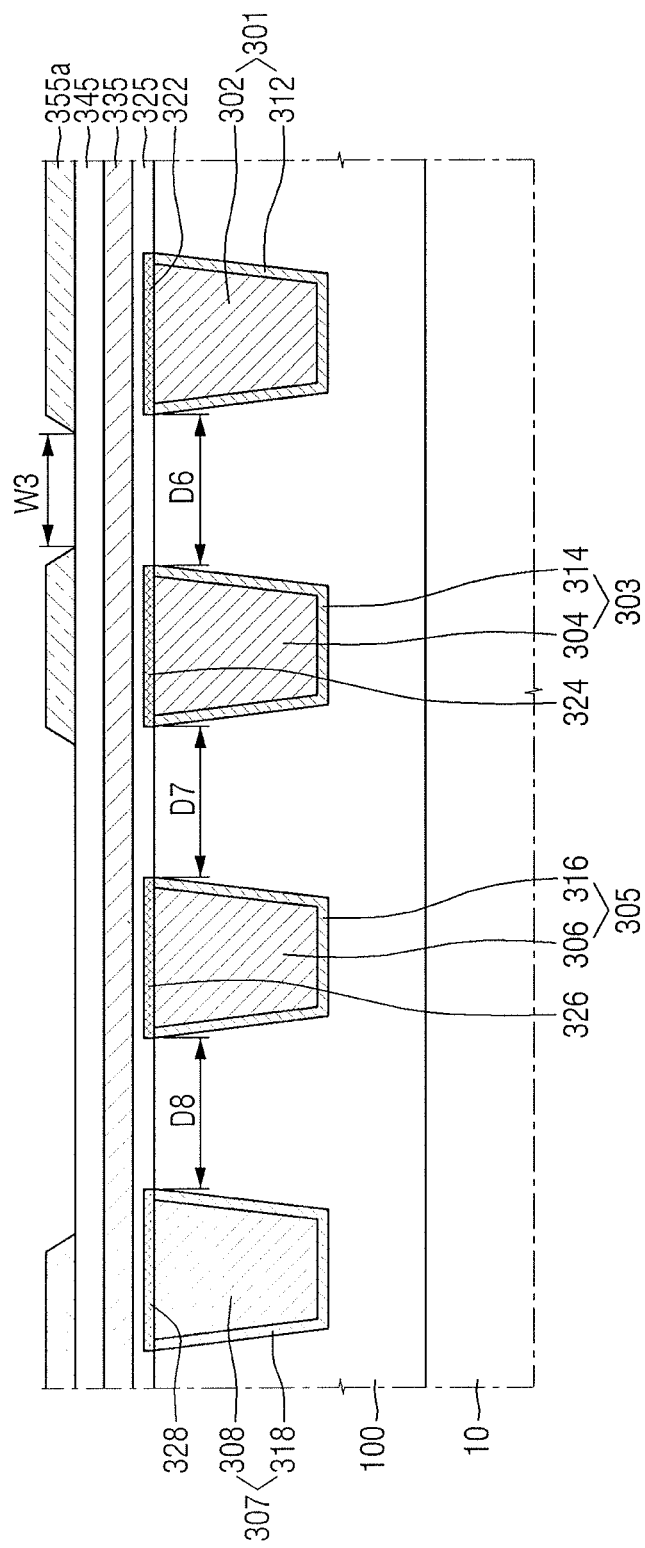

Referring to FIG. 10, the third hard mask film 355 is etched by using the photoresist patterns 365 and 365a as an etch mask, thereby forming third hard mask pattern 355a. The third hard mask film 355 may be etched by reactive ion etching (RIE).

An opening having a second distance D4 may be formed by the third hard mask pattern 355a. The second distance D4 may be smaller than the first distance D1. That is, the third hard mask film 355 may be etched by shrink patterning. The shrink patterning refers to etching the third hard mask 355 so that it has fine level differences. Accordingly an opening formed by a photoresist becomes narrower toward the center of the opening. By doing so, the third hard mask film pattern 355a may have an opening of a width W3 that is smaller than the minimum spacing in the design rule of the semiconductor device according to the exemplary embodiment of the present disclosure.

Figure 11:
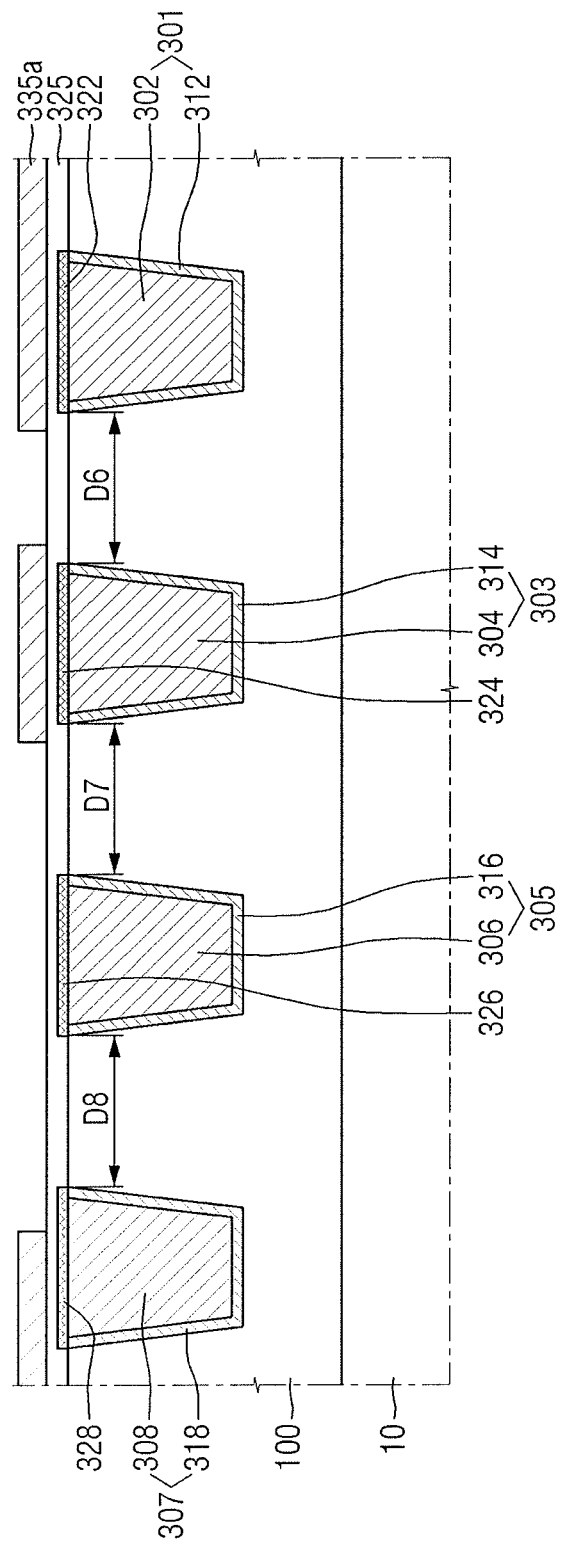

Referring to FIG. 11, the organic film 345 and the second hard mask film 335 are patterned by using the third hard mask pattern 355a as an etch mask, such that the second hard mask pattern 335a is formed.

In the foregoing description with reference to FIG. 10, the third hard mask film 355 is etched by shrink patterning using the photoresist patterns 365 and 365a as an etch mask. However, this is merely an example and shrink patterning may be used during the process of patterning the organic film 345 and the second hard mask film 335 as well. That is, in order to transfer the feature of the trench 331 (see FIG. 12) having a width less than the minimum spacing in the design rule of the semiconductor device, at least one of the third hard mask film 355, the organic film 345, and the second hard mask film 335 may be etched by the shrink patterning.

Figure 12:
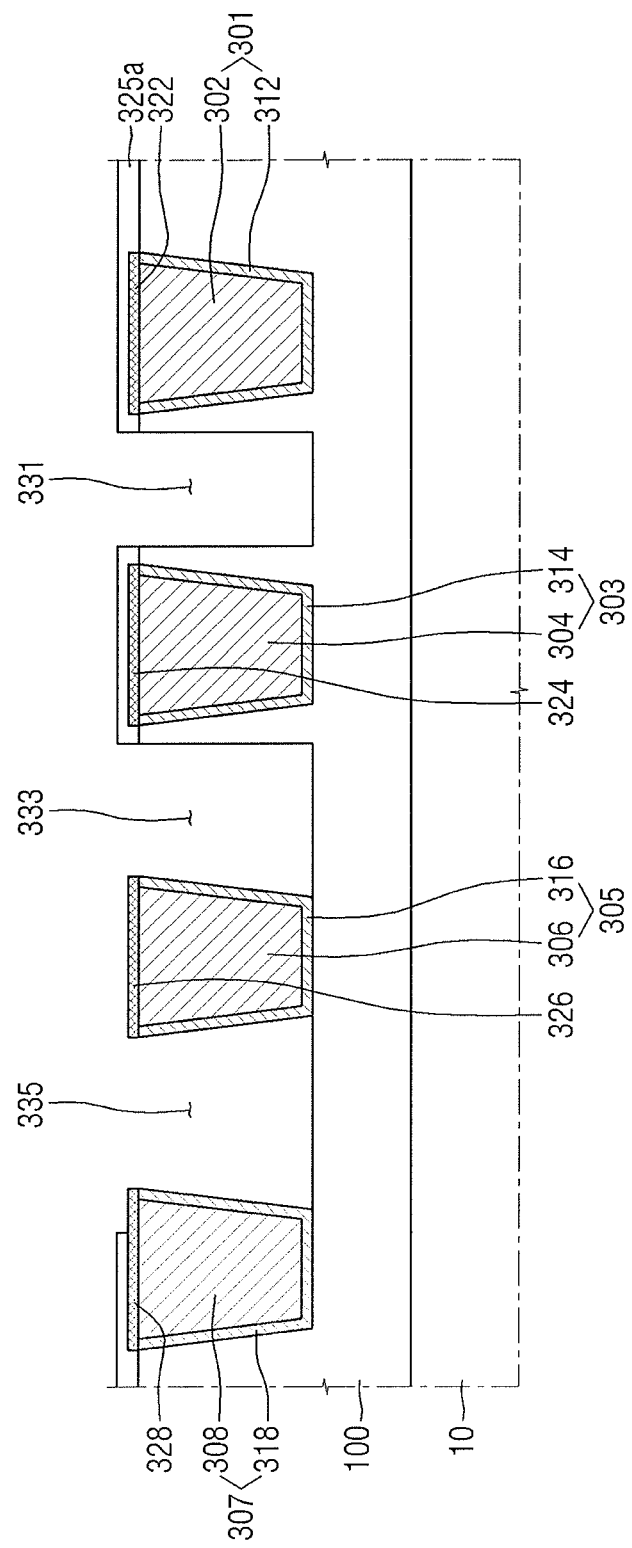
Figure 13:
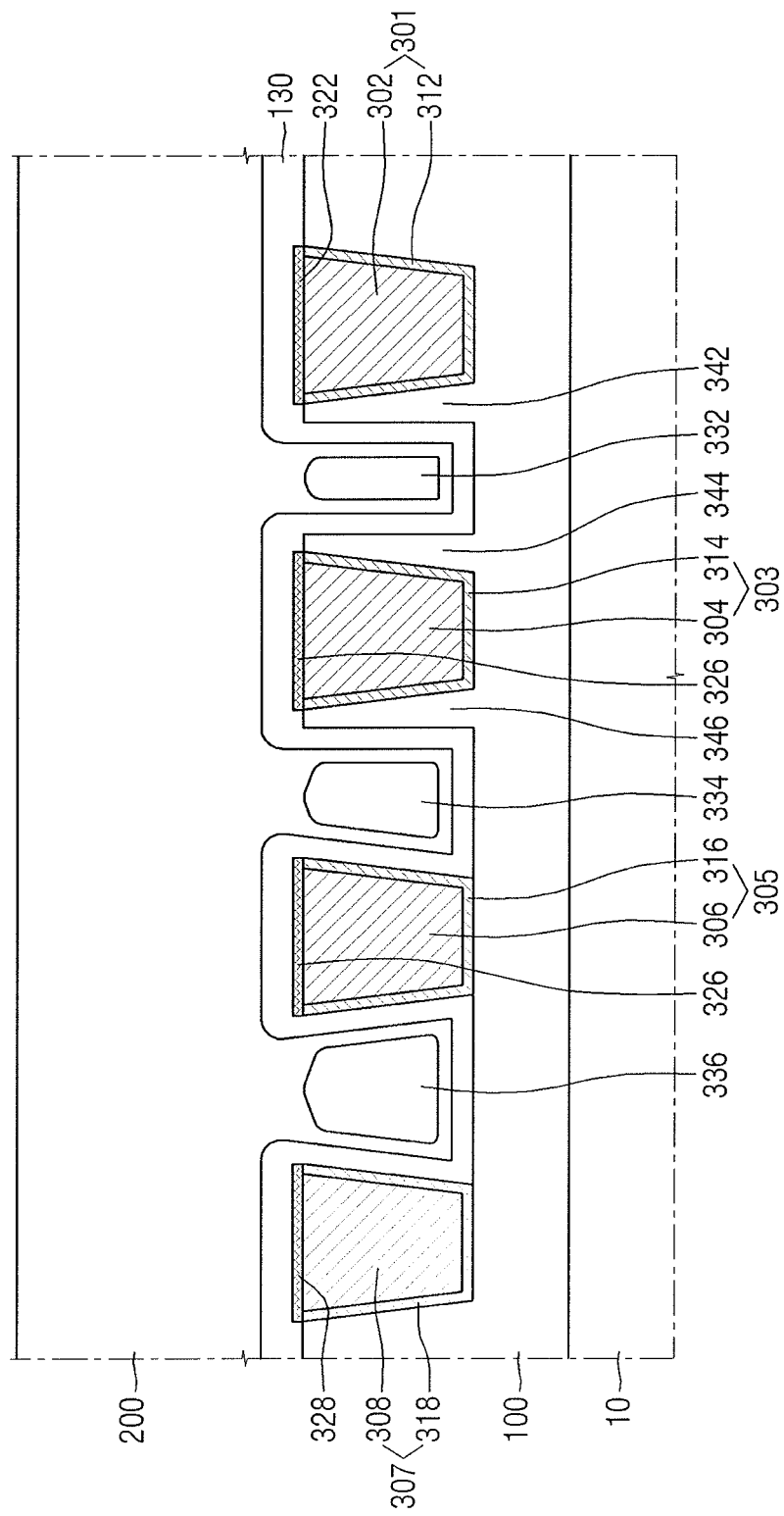

Referring to FIGS. 12 and 13, the first hard mask film 325 and the first interlayer insulation film 100 are patterned by using the second hard mask pattern 335a as an etch mask, thereby forming trenches 331, 333 and 335.

By virtue of the photoresist pattern 365 covering the first lower line 301 and the second lower line 303 and the shrink patterning using it, spacers 342, 344 and 346 are formed on one side wall of the first lower line 301 and both side walls of the second lower line 303, respectively.

Subsequently, the liner film 130 is formed to cover the first to fourth line patterns 301, 303, 305, and 307, and the trenches 331, 333 and 335, and the second interlayer insulation film 200 is formed on the liner film 130 to form the first to third airgaps 332, 334, and 336.

Referring back to FIG. 3, a via hole that penetrates the second interlayer insulation film 200 is formed, such that the via 204 and the upper line 201 are formed. The upper line 201 may be connected to the first lower line 301 through the via 204.

That is, according to the method of manufacturing a semiconductor device according to this exemplary embodiment of the present disclosure, the trench is formed between the lower line connected to the upper line through the via and another lower line spaced apart from the lower line by less than the minimum spacing in the design rule by using the shrink patterning, such that the airgap having the width smaller than the minimum spacing in the design rule can be formed.

By way of summation and review, although use of airgaps can achieve faster transmission of signals to improve performance, can save power, and reduce the overall size, conductive material in a line or a via may flow into an airgap during the manufacturing process to cause defects in a circuit as adjacent lines and via interfere one another. In contrast, in accordance with one or more embodiments, a semiconductor device including an airgap adjacent a via to connect to a line that is below an upper surface of an insulation film between the air gap and the line, to reduce interference from metal in the via to thereby improve reliability of the airgaps. In accordance with one or more embodiments, a method of manufacturing a semiconductor device including airgaps may reduce interference by a via to thereby improve reliability of the airgaps.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a first interlayer insulation film on a substrate;
a first lower line and a second lower line in the first interlayer insulation film, the first and second lower lines extending in a first direction, being spaced apart along a second direction, orthogonal to the first direction;
a first airgap and a second airgap between the first lower line and the second lower line along the second direction;
a second interlayer insulation film covering the first and second airgaps; and
a liner film on a bottom surface and a sidewall of the first and second airgaps,
wherein the first interlayer insulation film is between the first lower line and the first airgap,
wherein the first airgap is immediately adjacent to the first lower line and the second airgap is immediately adjacent to the second lower line, and
wherein a first thickness of the liner film, the first interlayer insulation film, and the second interlayer insulation film between the first lower line and the first airgap, and a second thickness of the liner film and the second interlayer insulation film between the second lower line and the second airgap are different.
2. The semiconductor device as claimed in claim 1, wherein the first thickness is thicker than the second thickness.
3. The semiconductor device as claimed in claim 1, further comprising:
an upper line on the first lower line, the upper line at least partially overlapping the first lower line; and
a via through which the upper line is connected to the first lower line.
4. The semiconductor device as claimed in claim 1, wherein a top of each of the first airgap and the second airgap is not higher than a top surface of the first lower line.
5. The semiconductor device as claimed in claim 1, wherein:
the second airgap has a first side wall adjacent to the second lower line and a second side wall opposed to the first side wall,
the first side wall and a bottom surface of the second airgap make a first angle, and
the second side wall and the bottom surface of the second airgap make a second angle, the first angle being different from the second angle.
6. The semiconductor device as claimed in claim 5, wherein the first angle is larger than the second angle.
7. The semiconductor device as claimed in claim 1, wherein a first distance between the first lower line and the first airgap, and a second distance between the second lower line and the second airgap are different.

8. The semiconductor device as claimed in claim 7, wherein the first distance is larger than the second distance.

* * * * *